United States Patent [19]

Miki

[11] Patent Number: 5,204,552

[45] Date of Patent: Apr. 20, 1993

[54] VOLTAGE CONTROLLED OSCILLATOR AND AN OPERATING METHOD THEREOF

[75] Inventor: Tsutomu Miki, Hyogo, Japan

[73] Assignee: Mitsubishi Denki Kabushiki Kaisha, Tokyo, Japan

[21] Appl. No.: 836,891

[22] Filed: Feb. 19, 1992

[30] Foreign Application Priority Data

Feb. 22, 1991 [JP] Japan ................................ 3-028923
Feb. 7, 1992 [JP] Japan ................................ 4-022923

[51] Int. Cl.⁵ .................... H03L 7/00; H03B 19/00
[52] U.S. Cl. .................................... 307/271; 328/14
[58] Field of Search ............... 328/14, 15; 307/271; 377/39

[56] References Cited

U.S. PATENT DOCUMENTS

| | | | |
|---|---|---|---|
| 4,320,521 | 3/1982 | Balakrishnan et al. | 375/36 |
| 4,517,684 | 5/1985 | Fennel | 377/39 |
| 4,719,458 | 1/1988 | Miesterfeld et al. | 340/825.5 |
| 4,739,323 | 4/1988 | Miesterfeld et al. | 340/825.5 |
| 4,890,010 | 12/1989 | Neudeck et al. | 307/270 |

FOREIGN PATENT DOCUMENTS 0078347  5/1983  European Pat. Off. .
216834   1/1990  Japan .
1496782  1/1978  United Kingdom .
2104330  3/1983  United Kingdom .

OTHER PUBLICATIONS

Stockl, Winterline: Elektrische MeBtechnik, Teujbner 1973, pp. 264-265.
Tietze: Schenk: Halbleiter-Schaltungstechnik, Springer-Verlag 1974, pp. 264-265.
English translation of Office Action (pp. 1-2).

*Primary Examiner*—Jin F. Ng
*Assistant Examiner*—Sinh Tran
*Attorney, Agent, or Firm*—Lowe, Price, LeBlanc & Becker

[57] ABSTRACT

Frequency data representing frequencies are stored in a memory in advance. An A/D converter converts an input signal V to a digital data. Addressing of the memory is carried out by using the digital data, and a frequency data is read out from a designated address. A count circuit counts prescribed clock pulses to provide a count data. A comparator compares the frequency data with the count data to provide the signal indicating comparison result, so that the counter circuit is reset.

18 Claims, 8 Drawing Sheets

VOLTAGE CONTROLLED OSCILLATOR AND AN OPERATING METHOD THEREOF

BACKGROUND OF THE INVENTION

1. Field of the Invention

The present invention relates generally to voltage controlled oscillators (VCO), and more particularly, to digitally implemented voltage controlled oscillators controlling an oscillating frequency with an input voltage. The invention further relates to a method of operating such voltage controlled oscillators.

2. Description of the Background Art

A voltage controlled oscillator for converting an analog signal to an output signal having a variable frequency corresponding to that analog signal is used in various circuits such as a radio tuning circuit, and a sound synthesizing circuit for electronic instruments.

FIG. 12 is a circuit diagram of a conventional voltage controlled circuit comprising an analogue circuit. The voltage controlled circuit comprises a differential amplifier 10, a comparator 11, a buffer amplifier 12, an NPN-type transistor 13, resistors 21–30, and a capacitor 31. An input signal V is applied to an input terminal 14, and an output signal F having a frequency corresponding to a voltage of input signal V is obtained from an output terminal 15. Operating voltage of the voltage controlled oscillator is $V_{DD}$. Resistance value of resistor 21 is 2R, and resistance value of each of the resistors 22–24 is R. In addition, resistance value of each of the resistors 26, 27, and 29 is R, Capacitance value of capacitor 31 is C.

The operation of the voltage controlled oscillator will be described. At first, when input signal F is in a low level (referred to as "L" hereinafter), transistor 13 is in an off state. The potential of a positive input terminal N2 of comparator 11 is set to $(\frac{1}{3}) \cdot V_{DD}$ by resistors 26, 27, and 29, since the output of buffer amplifier 12 becomes ground potential. If input signal V having a positive voltage is applied to input terminal 14 when transistor 13 is in an off state, capacitor 31 is charged through resistor 21. Since a negative input terminal N1 of differential amplifier 10 has the fixed potential, the output voltage of differential amplifier 10 decreases. The potential level of output signal F of comparator 11 is inverted into a high level (referred to as "H" hereinafter) when the output voltage becomes lower than the voltage $(\frac{1}{3}) \cdot V_{DD}$ of positive input terminal N2 of comparator 11.

As a result, transistor 13 turns on, so that the capacitor 31 is discharged and the output voltage of the differential amplifier 10 is increased. Since the output of buffer amplifier 12 becomes power supply potential $V_{DD}$, the potential of positive input terminal N2 of comparator 11 is set to $(\frac{2}{3}) \cdot V_{DD}$ by resistors 26, 27 and 29. When the output voltage of differential amplifier 10 becomes higher than the potential $(\frac{2}{3}) \cdot V_{DD}$ of positive input terminal N2 of comparator 11, the potential level of output signal F of comparator 11 is inverted into "L", so that the transistor 13 turns off.

In this manner, output signal F having the frequency corresponding to the voltage of input signal V is obtained.

In the voltage controlled oscillator described above, the relationship between an input voltage $V_{in}$ of input signal V and a frequency $f_0$ of output signal F will be represented by the following equation:

$$f_0 = (\tfrac{1}{3}) \cdot (V_{in} / R \cdot C \cdot V_{DD}) \tag{1}$$

As can be seen from the above equation (1), in the conventional voltage controlled oscillator comprising the analogue circuit, a voltage-frequency converting characteristic is dependent on operating voltage $V_{DD}$, value R of an input resistor and capacitance value C of capacitor 31. In particular, capacitor 31 has the characteristic varied by temperature. That is, all kinds of capacitors have a characteristic which varies depending on a temperature around the capacitor. It is required to control temperature more accurately to obtain more precise oscillation. However, more accurate temperature controlling is difficult to be carried out. Therefore, it is difficult to obtain a stable characteristic, since the converting characteristic is varied by variation of operating voltage and operating temperature.

Although the linear converting characteristic in which input voltage $V_{in}$ is proportional to frequency $f_0$ can be obtained, the non-linear converting characteristic cannot be obtained. Furthermore, if the converting characteristics are to be changed, it is required to change resistance value of the resistor or capacitance value of the capacitor.

SUMMARY OF THE INVENTION

One object of the present invention is to stabilize operation of a voltage controlled oscillator despite variation of operating voltage or temperature.

Another object of the present invention is to establish an arbitrary conversion characteristic to a voltage controlled oscillator.

Yet another object of the present invention is to provide a method of stabilizing operation of voltage controlled oscillators despite variation of operating voltage or temperature.

A further object of the present invention is to provide a method of stabilizing arbitrary conversion characteristic to a voltage controlled oscillator.

A further object of the present invention is to easily change conversion characteristic.

A further object of the present invention is to provide a method of easily changing conversion characteristic.

A voltage controlled oscillator in accordance with the present invention includes an analog to digital converter, a storage circuit, a clock pulse generator, a counter, and a comparator. The analogue to digital converter converts an input voltage to a digital signal. The storage circuit stores in advance a frequency data corresponding to a frequency in each address. The frequency data is read out from an address designated by the digital signal. The clock pulse generator generates clock pulses. The counter counts the clock pulses generated by the clock pulse generator to provide count data indicating count value. The comparator compares the frequency data read out from the storage circuit with the count data provided from the counter to provide the signal indicating comparison result. The counter is reset when frequency data coincides with the count data.

In the voltage controlled oscillator in accordance with the present invention, an input voltage is converted to a digital signal by an analogue digital converter. By utilizing a digital signal as an address signal, a frequency data is read out from a storage circuit. Clock pulses are counted by a counter to provide the count data. Frequency data is compared with the count data by a comparator to provide comparison result. When frequency data coincides with the count data, the counter is reset. Therefore, the signal provided from the comparator has the frequency corresponding to frequency data. Thus, the signal provided from the comparator has the frequency corresponding to the frequency data.

Since voltage-frequency conversion is carried out by digital process in the voltage controlled oscillator, the converting characteristic is not dependent on operating voltage and operating temperature. A stable converting characteristic is obtained even if operating voltage and operating temperature vary.

Further, since it is possible to store arbitrary frequency data in the storage circuit, the relationship between the input voltage and an oscillating frequency can be arbitrarily set. As a result, the storage circuit can provide arbitrary converting characteristic.

The storage circuit may include an erasable and programmable storage circuit.

In this case, the converting characteristic can be easily changed, since it is possible to change frequency data stored in advance in the storage circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
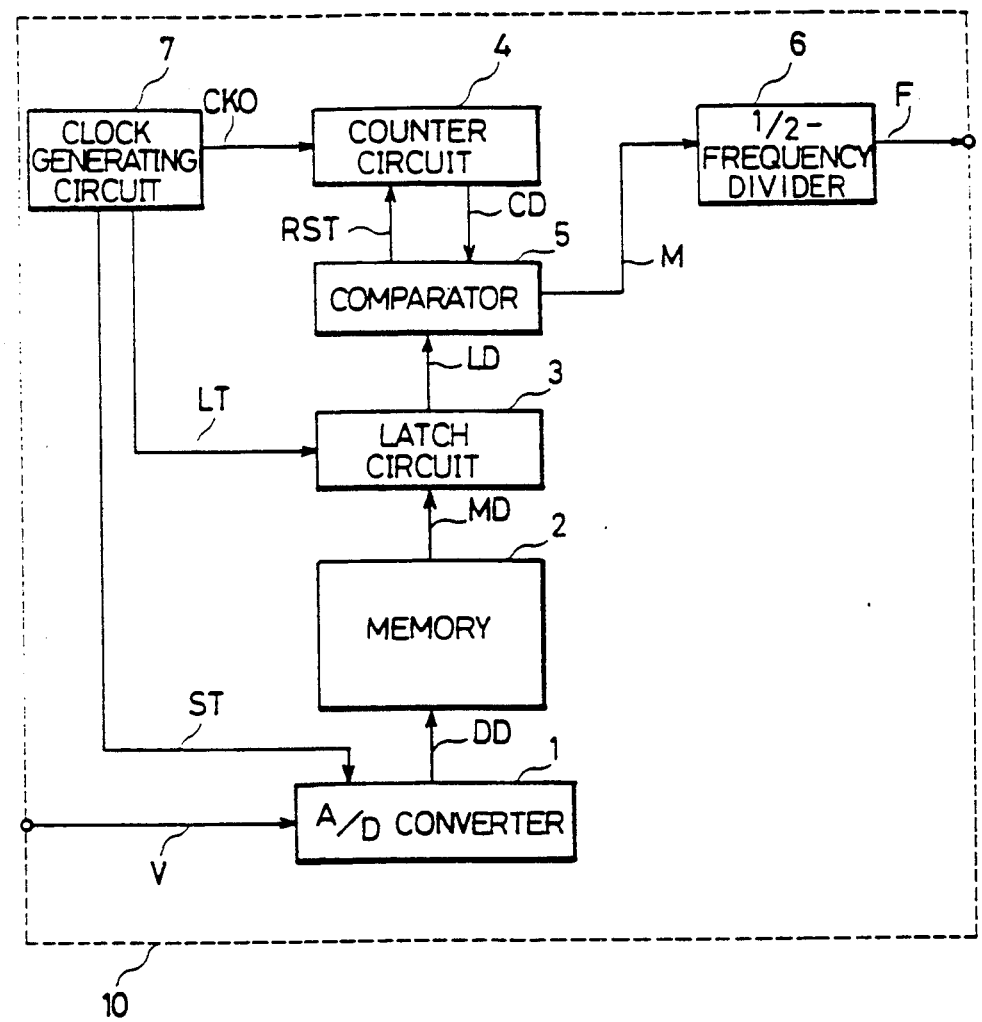
FIG. 1 is a block diagram showing the construction of a voltage controlled oscillator in accordance with an embodiment of the present invention.

In FIG. 1, a voltage controlled oscillator 10 comprises an A/D (analogue digital) converter 1, a memory 2, a latch circuit 3, a counter circuit 4, a comparator 5, a ½-frequency-divider 6, and a clock generating circuit 7. Preferably, all of these circuits are formed on a single chip.

A/D converter 1 is responsive to a start signal ST applied from clock generating circuit 7 to convert an externally applied input signal V to a digital data DD. Digital data DD is applied to memory 2 as an address signal. In each address of memory 2, a frequency data corresponding to a frequency is stored in advance. Frequency data MD read out from memory 2 is applied to latch circuit 3. Latch circuit 3 is responsive to a latch signal LT applied from clock generating circuit 7 to latch frequency data to provide the same to comparator 5.

Clock generating circuit 7 generates a clock signal CK0 of a prescribed frequency. Counter circuit 4 counts a clock pulse of a clock signal CK0 to apply a count data CD indicating count value to comparator 5. Comparator 5 compares a frequency data LD applied from latch circuit 3 with the count data CD applied from counter circuit 4 to provide an output signal M indicating comparison result to ½-frequency-divider 6. When latched data LD coincides with count data CD, comparator 5 applies a reset signal RST to circuit 4, so that the counter circuit 4 is reset. ½-frequency-divider 6 divides output signal M into two to externally provide a rectangular wave of duty 50% as an output signal F.

Figure 2:
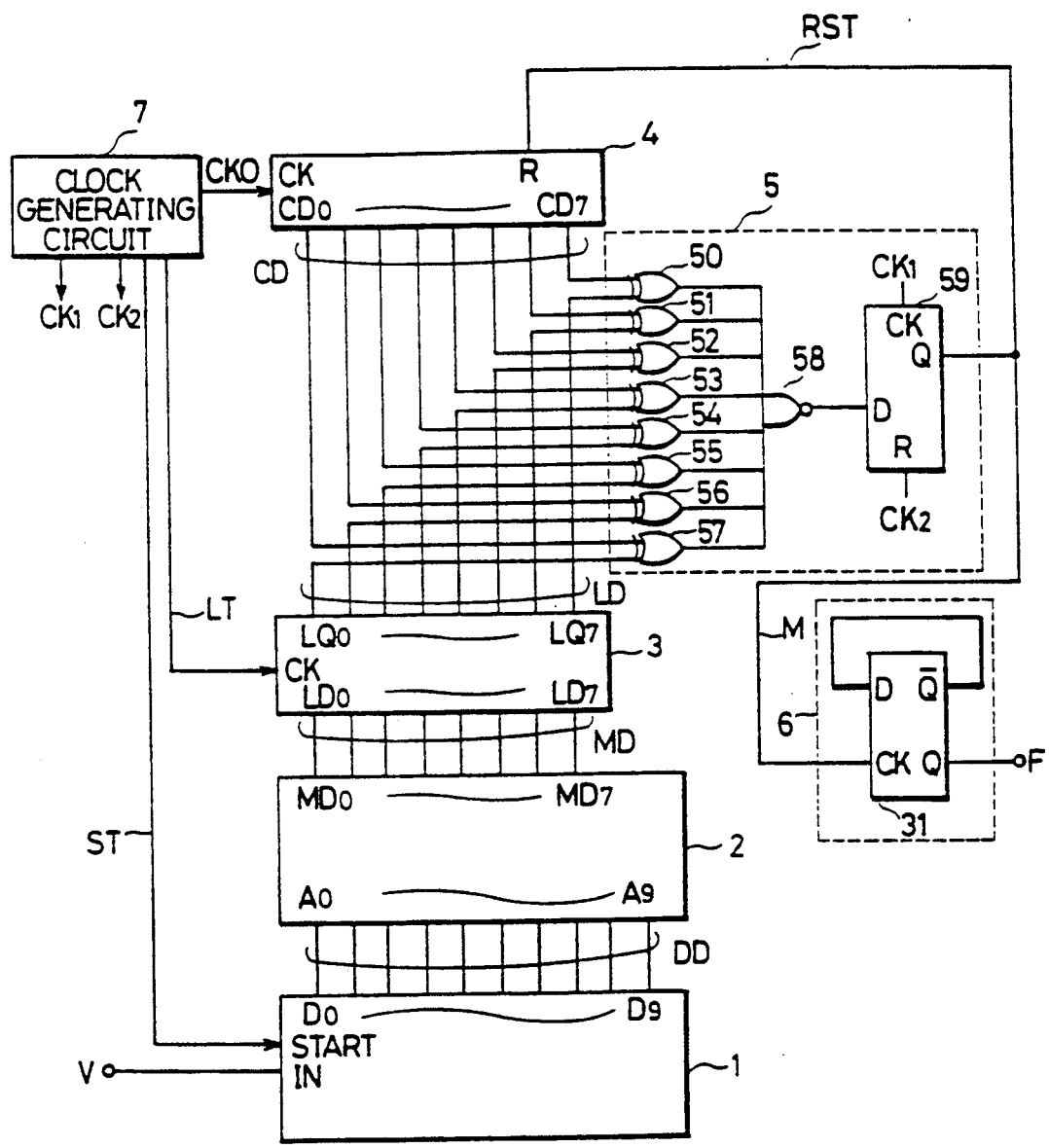
FIG. 2 is a block diagram showing the detailed construction of the voltage controlled oscillator shown in FIG. 1.

FIG. 2 is a block diagram showing each of the proportions of voltage controlled oscillator 10 shown in FIG. 1. A/D converter 1 has an input terminal IN receiving input signal V, a start terminal START receiving start signal ST, and 10-bit data output terminals D0-D9. Memory 2 has 10-bit address input terminals A0-A9, and 8-bit data output terminals MD0-MD7. For instance, memory 2 comprises a non-volatile memory. Latch circuit 3 has 8-bit data input terminals LD0-LD7, 8-bit data output terminals LQ0-LQ7, and a clock terminal CK receiving latch signal LT.

Counter circuit 4 has clock terminal CK receiving clock signal CKO, 8-bit data output terminals CD0-CD7 providing the count data, and a reset terminal R receiving a reset signal RST.

Comparator 5 comprises eight exclusive OR gates 50-57, a NOR gate 58, and a D type flipflop 59. One input terminal of the gates 50-57 is connected to data output terminals LQ0-LQ7 of latch circuit 3, respectively. The other input terminal of the gates 50-57 is connected to data output terminals CD0-CD7 of counter circuit 4, respectively. The output terminals of the gates 50-57 are connected to the input terminal of the gate 58. The output terminal of the gate 58 is connected to a data input terminal D of flipflop 59. Clock signals CK1 and CK2 are applied from clock generating circuit 7 to clock terminal CK and reset terminal R of flipflop 59, respectively. A data output terminal Q of flipflop 59 is connected to reset terminal R of counter circuit 4. ½-frequency-divider 6 comprises a D type flipflop 31. Output terminal Q of flipflop 59 is further connected to clock terminal CK of flipflop 31.

In clock generating circuit 7, an oscillator such as a TCXO (Temperature Controlled Crystal Oscillator)

having the oscillating frequency which is not dependent on temperature is utilized.

The operation of the voltage controlled oscillator shown in FIG. 2 is described with reference to waveform diagrams in FIG. 3 and 4.

In memory 2, a plurality of 8-bit frequency data representing the oscillating frequency are stored in advance. When start signal ST shown in FIG. 3 rises to "H", A/D converter 1 begins A/D conversion for converting input signal V to 10-bits of digital data DD. When A/D conversion ends, start signal ST falls to "L". A/D converter 1 provides converted digital data DD from data output terminals D0–D9. Digital data DD is applied to address input terminals A0–A9 of memory 2, so that an address within memory 2 is designated by digital data DD, and frequency data MD is read from the designated address to data output terminals MD0–MD7.

Figure 3:
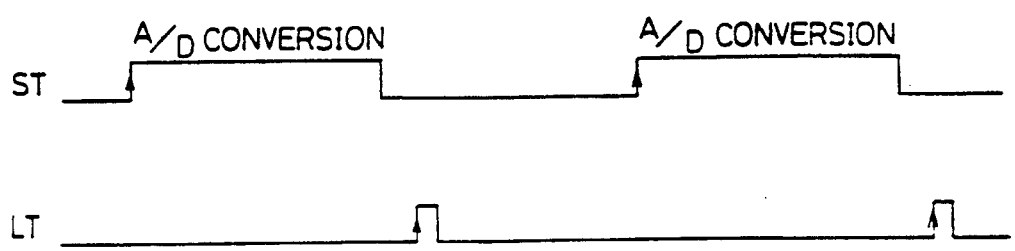
FIG. 3 is a diagram of signal waveforms for describing the operation of the voltage controlled oscillator shown in FIG. 1 and 2.

Latch circuit 3 is responsive to the rise of latch signal LT shown in FIG. 3 to latch frequency data MD applied to data input terminals LD0–LD7, and provides the same from data output terminals LQ0–LQ7 as frequency data LD.

Figure 4:
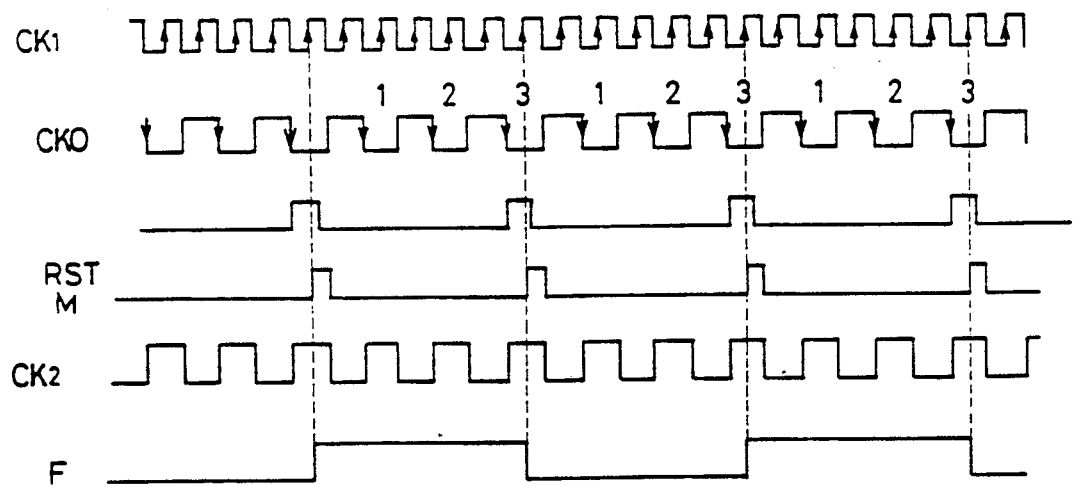
FIG. 4 is a signal waveform diagram for describing the operation of the voltage controlled oscillator shown in FIGS. 1 and 2.

Counter 4 counts the pulses of clock signal CK0 applied to clock terminal CK as shown in FIG. 4 to provide count data CD from data output terminals CD0–CD7.

When frequency data LD coincides with count data CD, all of the output signals of the gates 50–57 turn to "L". The output signal of the gate 58 rises to "H". After the signal applied to data input terminal D of flipflop 59 is provided from data output terminal Q in response to clock signal CK1, flipflop 59 is reset in response to clock signal CK2. In this manner, the output signal of flipflop 59 rises to "H" and then falls to "L". The output signal of flipflop 59 is applied to count circuit 4 as a reset signal RST, and further applied to ½-frequency-divider 6 as a signal M indicating comparison result (see FIG. 4).

Counter circuit 4 is reset in response to the rise of reset signal RST to resume counting operation. ½-frequency-divider 6 divides signal M shown in FIG. 4 into two to provide the divided signal as an output signal F. FIG. 4 shows the case when the frequency data read out from memory 2 is representing "3".

There is no need for start signal ST and latch signal LT shown in FIG. 3 to be synchronized with clock signal CK0 shown in FIG. 4.

In the above embodiment, output signal F having arbitrary frequency corresponding to the voltage of input signal V is obtained by determining reset timing of counter circuit 4 in response to frequency data read out from memory 2.

Figure 5:
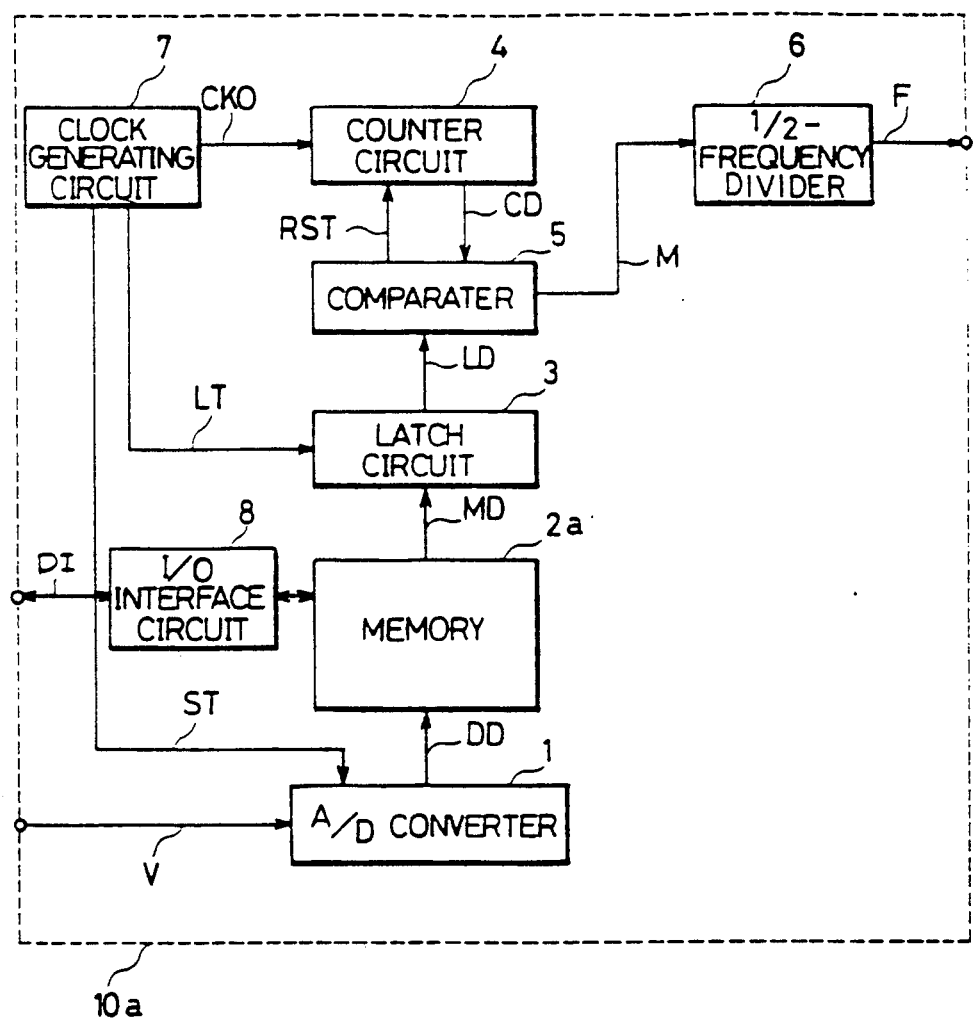
FIG. 5 is a block diagram showing the construction of the voltage controlled oscillator in accordance with another embodiment of the present invention.

FIG. 5 is a block diagram showing the construction of the voltage controlled oscillator in accordance with another embodiment of the present invention. The difference between voltage controlled oscillator 10a in FIG. 5 and voltage controlled oscillator 10 in FIG. 1 is that the former comprises memory 2a instead of memory 2, and that it additionally comprises an I/O interface circuit 8. Memory 2a comprises an electrically writable and readable non-volatile memory. A frequency data DI can be externally written into memory 2a through I/O interface circuit 8. In addition, the frequency data stored in memory 2a can be read out directly through I/O interface circuit 8.

In the voltage controlled oscillators in FIGS. 1 and 5, since digital process is employed for the conversion of the input voltage to the oscillating frequency, stable converting characteristic which is not dependent on operational voltage and temperature can be obtained.

Since it is possible to store arbitrary frequency data in memory 2 and 2a, the arbitrary converting characteristic can be obtained.

In particular, in the embodiment of FIG. 5, the converting characteristic can be easily changed, since the frequency data stored in memory 2a is easily changed.

Figure 6:
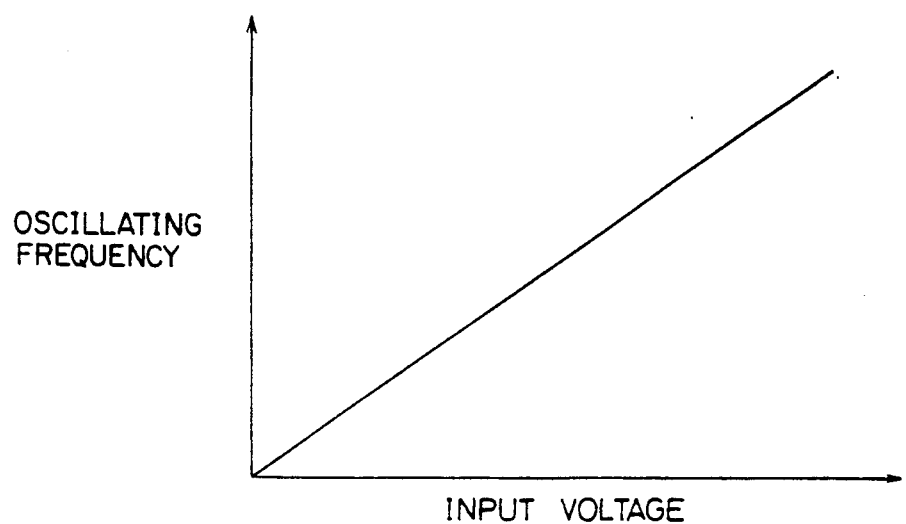
FIG. 6 is a diagram showing one example of the converting characteristics of the voltage controlled oscillator shown in FIGS. 1 and 5.
Figure 7:
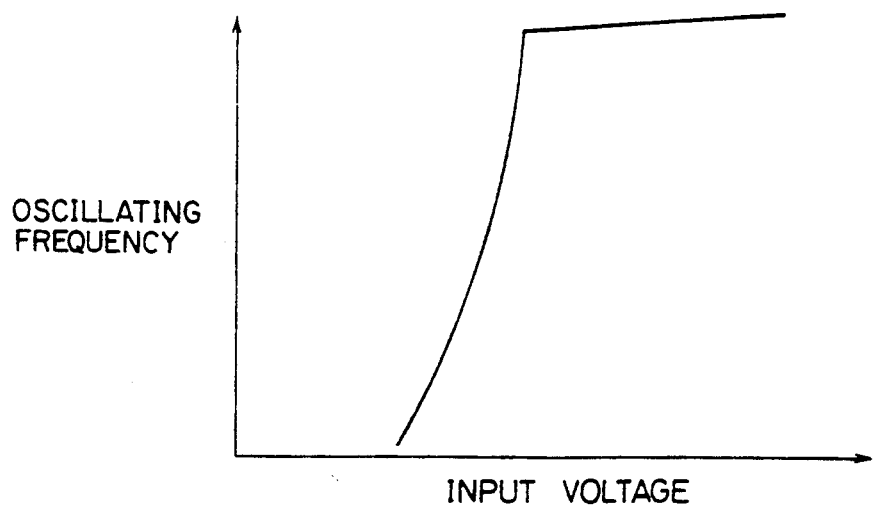
FIG. 7 is a diagram showing another example of the converting characteristics of the voltage controlled oscillator shown in FIGS. 1 and 5.

In accordance with voltage controlled oscillator in FIGS. 1 and 5, a linear converting characteristic shown in FIG. 6 and a non-linear converting characteristic shown in FIG. 7 can be obtained.

Figure 8:
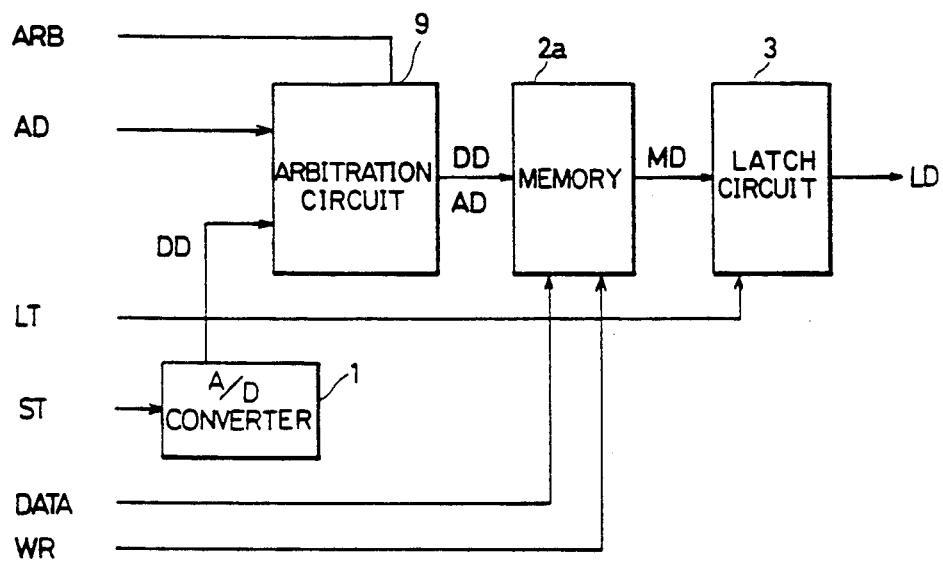
FIG. 8 is a block diagram showing an example of an input/output interface circuit using an arbitration circuit.

As shown in FIG. 8, when an arbitration circuit 9 is used in an input/output interface circuit of a voltage controlled oscillator 10a shown in FIG. 5, memory 2a can have its contents changed by an external microprocessor without interrupting operation of voltage controlled oscillator. Arbitration circuit 9 is controlled by a control signal ARB applied from the external microprocessor. Arbitration circuit 9 is applied with an address signal AD from the microprocessor, and a digital data DD converted from an A/D converter 1. A frequency data DATA and a write signal WR are applied to memory 2a from the microprocessor.

Figure 9:
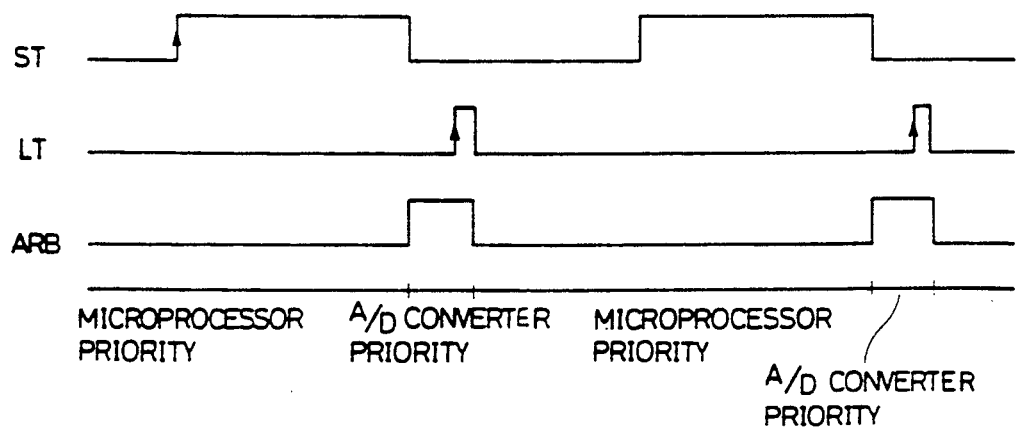
FIG. 9 is a signal waveform diagram for explaining an operation of an input/output interface circuit shown in FIG. 8.

As shown in FIG. 9, when control signal ARB is in "L" level, arbitration circuit 9 applies an address signal AD from the microprocessor to memory 2a. When control signal ARB is in "H" level, arbitration circuit 9 applies a digital data DD from A/D converter 1 to memory 2a.

In this manner, the frequency data stored in memory 2a can be changed by the microprocessor without interrupting operation of voltage controlled oscillator 10a.

Figure 10:
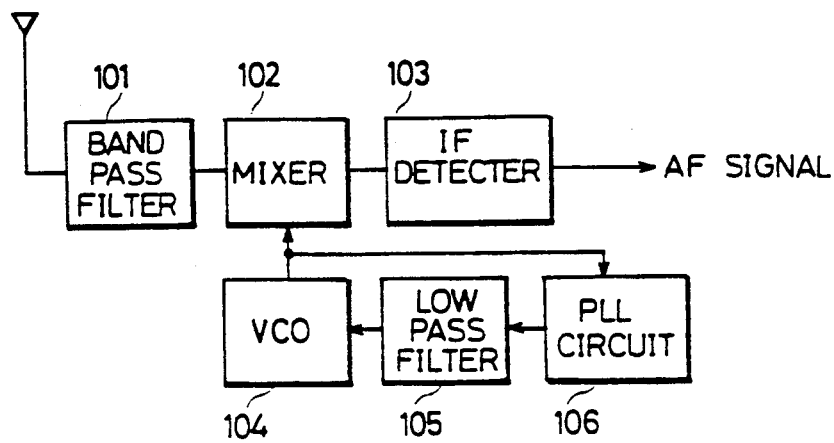
FIG. 10 is a block diagram showing an example of an application of voltage controlled oscillator shown in FIG. 5.

FIG. 10 is a block diagram showing an example of a voltage controlled oscillator mentioned in the above embodiment applied in a receiving tuning circuit used in a television receiver, the radio, a portable radio, and so on.

The receiving tuning circuit shown in FIG. 10 comprises a bandpass filter 101, a mixer 102, and an intermediate frequency detector 103, a voltage controlled oscillator 104, a low pass filter 105, and a PLL (Phase Locked Loop) circuit 106. The voltage controlled oscillator 10a shown in FIG. 5 is used as voltage controlled oscillator 104.

In a conventional tuning circuit, there is a restriction in the range of the oscillating frequency of the voltage controlled oscillator. Therefore, a plurality of voltage controlled oscillators corresponding to respective frequency bands such as a VHF band signal and an UHF band signal of a television broadcasting, and an FM signal and an AM signal of a radio broadcasting and so on.

However, when voltage controlled oscillator 10a of the above embodiment is used, the contents of memory 2a with voltage controlled oscillator 10a can be changed by an external microprocessor. As a result, oscillating signals corresponding to respective frequency bands can be easily obtained.

Figure 11:
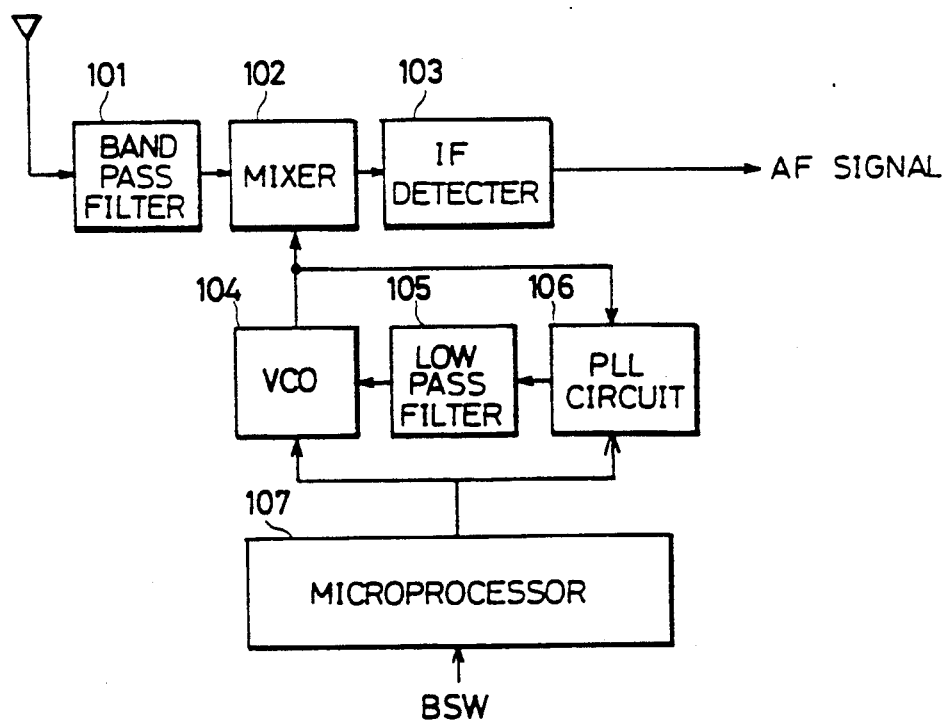
FIG. 11 is a block diagram showing an example of another application of the voltage controlled oscillator shown in FIG. 5.
Figure 12:
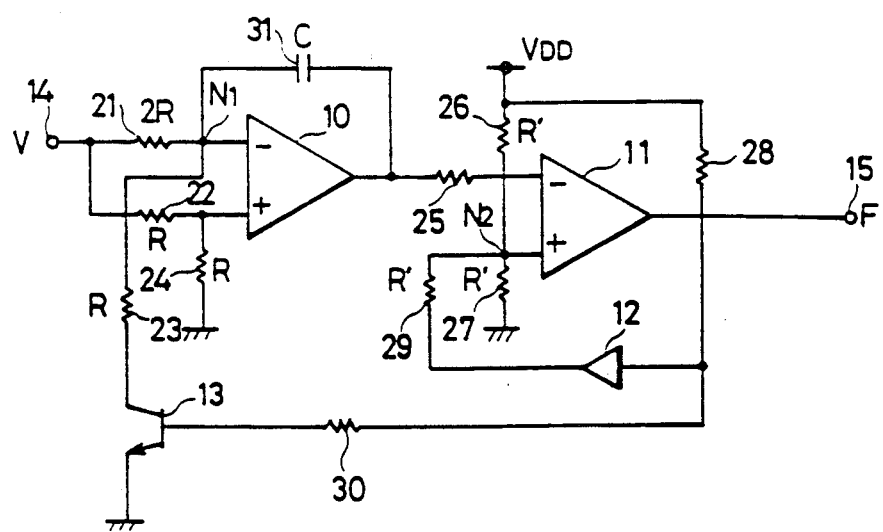
FIG. 12 is a diagram showing a further example of the converting characteristics of the voltage controlled oscillator in FIGS. 1 and 5.

FIG. 11 is a block diagram showing an example of a voltage controlled oscillator of the above embodiment applied in a receiving tuning circuit which can handle the signals of a plurality of frequency bands.

The receiving tuning circuit shown in FIG. 11 comprises a bandpass filter 101, a mixer 102, an intermediate detector 103, a voltage controlled oscillator 104, a low pass filter 105, a PLL circuit 106, and a microprocessor 107. Voltage controlled oscillator 10a shown in FIG. 5 is used as voltage controlled oscillator 104.

Microprocessor 107 is responsive to a band switching signal BSW externally applied to write data into to voltage controlled oscillator 104 and PLL circuit respectively. Voltage controlled oscillator 104 oscillates at a frequency corresponding to a direct current potential applied from low pass filter 105. Voltage controlled oscillator 104 can control a central frequency of its oscillating frequency by microprocessor 107 changing the contents of a memory within voltage controlled oscillator 104. As a result, it is permitted to carry out turning over plurality of frequency bands.

In the embodiment of FIG. 5, the electrically writable and readable non-volatile memory is used as memory 2a: however, the electrically writable and readable volatile memory may be used as memory 2a, instead.

½-frequency-divider 6 is used to obtain the rectangular wave of duty 50% in the embodiment described above, but it is not necessary when duty of the output signal does not need to be 50%.

Furthermore, the bit number of the data output terminal of A/D converter 6, the bit number of the address input terminal and of the data output terminal of memory 2, the bit number of the data input terminal and of the data output terminal of latch circuit 3, the bit number of the data output terminal of counter circuit 4, and the like may be arbitrarily selected and not limited to those in the example of FIG. 2.

As will be understood from the above description, in accordance with the present invention, a voltage controlled oscillator which can operate stably even if operating voltage and operating temperature vary, and which has arbitrary converting characteristic can be obtained.

In addition, a voltage controlled oscillator which can easily change the converting characteristic is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage controlled oscillator, comprising:
    analog to digital converting means for converting an input voltage to a digital signal;
    storage means for storing in advance frequency data corresponding to frequencies in respective addresses, receiving said digital signal, and reading out a frequency data from an address designated by said digital signal;
    clock pulse generating means for generating clock pulses;
    counting means for counting said clock pulses generated from said clock pulse generating means to provide a count data indicating count value; and
    comparing means for comparing the frequency data read out from said storage means with the count data provided from said counting means, to provide a signal indicating comparison result, and to reset said counting means when said frequency data coincides with said count data.

2. The voltage controlled oscillator according to claim 1, further comprising:
    frequency-dividing means for frequency-dividing said signal indicating comparison result provided from said comparing means.

3. The voltage controlled oscillator according to claim 1, further comprising:
    data holding means for holding temporarily said frequency data read out from said storage means.

4. The voltage controlled oscillator according to claim 1, wherein said storage means comprises non-volatile memory means.

5. The voltage controlled oscillator according to claim 1, wherein said storage means comprises electrically programmable non-volatile memory means.

6. The voltage controlled oscillator according to claim 18, wherein said comparing means further comprises:
    NOR gate means for receiving outputs of said plurality of exclusive OR gate means.

7. The voltage controlled oscillator according to claim 6, wherein said comparing means further comprises:
    flipflop means for providing a pulse signal having a prescribed width in response to an output of said NOR gate means to apply said pulse signal to said frequency-dividing means, and to apply said pulse signal to said counting means as a reset signal.

8. An operating method for a voltage controlled oscillator comprising the steps of:
    storing in advance at a plurality of addresses of a digital memory a plurality of frequency data corresponding to a plurality of frequencies;
    converting an external analog input signal to a digital signal;
    inputting said digital signal to said digital memory and reading out said frequency data at an address location corresponding to said digital signal;
    generating clock pulses;
    counting said generating clock pulses to generate a count data indicating count value; and
    comparing said read out frequency data with said generated count data to provide a signal indicating comparison result, and to reset said counting when said read out frequency coincides with said generated count data.

9. The operation method according to claim 8, comprising the step of:
    frequency-dividing said signal indicating comparison result.

10. A method of converting an analog signal to an output signal having a variable frequency corresponding to said analog signal, comprising the steps of:
    converting said analog signal to a digital control signal;
    prestoring in a memory a plurality of data corresponding to a plurality of frequencies;
    reading out any one of said stored plurality of said frequency data from said memory in response to said digital control signal;
    generating clock pulses;
    counting said clock pulses to generate count data indicative of a count value;
    comparing said read out frequency data with said count data to provide a signal indicating a comparison result;
    resetting said count value when said frequency data read out during the preceding step coincides with said count value;
    varying said prestored plurality of data; and
    supplying said comparison result as said output signal.

11. The method of claim 10, wherein the step of varying is carried out in response to an externally developed control parameter.

12. The method of claim 10, wherein said prestored data are supplied by a microprocessor.

13. The method of claim 11, wherein said plurality of prestored data are varied dynamically during conversion.

14. A voltage controlled oscillator, comprising:
an analog-to-digital converter for converting an input voltage to a digital signal;
storage means for prestoring in storage locations corresponding to respective addresses frequency data corresponding to frequencies and for reading out frequency data corresponding to frequencies and for reading out frequency data from an address designated by said digital signal;
a clock pulse generator for generating clock pulses;
a counter for counting said clock pulses generated from said clock pulse generating means to provide a count data indicating count value;
means for supplying address frequency data to said storage means and for changing said address frequency data; and
a comparator for comparing the frequency data read out from said storage means with the count data provided from said counting means, to provide a signal indicating a comparison result, and to reset said counting means when said frequency data coincides with said count data.

15. The oscillator of claim 14, wherein said means for supplying address frequency data further comprises means for changing said address frequency data dynamically during analog-to-frequency conversion by said converter.

16. A voltage controlled oscillator, comprising:
analog to digital converting means for converting an input voltage to a digital signal;
storage means for storing a plurality of frequency information receiving said digital signal, and in response thereto, outputting corresponding stored frequency information from among said plurality of frequency information;
counting means for counting clock pulses and generating count information; and
means for generating an output signal based upon said frequency information from said storage means and said count information to provide a signal indication comparison result, and to reset said counting means when said frequency information coincides with said count information.

17. The method of claim 11, wherein said prestored data are supplied by a microprocessor.

18. A voltage controlled oscillator, comprising:
analog to digital converting means for converting an input voltage to a digital signal;
storage means for storing in advance frequency data corresponding to frequencies in respective addresses, receiving said digital signal, and reading out a frequency data from an address designated by said digital signal;
clock pulse generating means for generating clock pulses;
counting means for counting said clock pulses generated from said clock pulse generating means to provide a count data indicating count value; and
comparing means for comparing the frequency data read out from said storage means with the count data provided from said counting means, to provide a signal indicating comparison result, and to reset said counting means when said frequency data coincides with said count data, wherein
each of said frequency data has a plurality of bits, and each of said count data has the same plurality of bits as that of said frequency data, and
said comparing means includes;
a plurality of exclusive OR gate means each receiving a corresponding bit of said frequency data and a corresponding bit of said count data.

* * * * *